(12) United States Patent  
Hoshi et al.

(10) Patent No.: US 7,811,872 B2
(45) Date of Patent: Oct. 12, 2010

(54) METHOD FOR MANUFACTURING A FIELD EFFECT TRANSISTOR HAVING A FIELD PLATE

(75) Inventors: Shinichi Hoshi, Tokyo (JP); Masanori Itoh, Tokyo (JP); Hideyuki Okita, Tokyo (JP); Toshiharu Marui, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 155 days.

(21) Appl. No.: 12/149,823

(22) Filed: May 8, 2008

(65) Prior Publication Data

US 2008/0283844 A1    Nov. 20, 2008

(30) Foreign Application Priority Data

May 16, 2007    (JP) .............................. 2007-129970

(51) Int. Cl.
*H01L 21/338* (2006.01)
(52) U.S. Cl. ...................... 438/172; 438/571; 438/285; 438/478; 438/270; 257/76; 257/E21.403; 257/E21.41; 257/E29.246
(58) Field of Classification Search ................. 257/192, 257/E21.403, E29.246; 438/571, 285, 478, 438/270
See application file for complete search history.

(56) References Cited

U.S. PATENT DOCUMENTS

2003/0203604 A1 * 10/2003 Makita ........................ 438/571
2006/0102929 A1    5/2006 Okamoto et al.

OTHER PUBLICATIONS

Tamotsu Hashizume et al., "Surface Control Process of AlGaN for Suppression of Gate Leakage Currents in AlGaN/GaN Heterostructure Field Effect Transistor," Japanese Journal of Applied Physics, vol. 45, No. 4, 2006, pp. L111-L113.

* cited by examiner

*Primary Examiner*—Matthew Smith
*Assistant Examiner*—Wilner Jean Baptiste
(74) *Attorney, Agent, or Firm*—Rabin & Berdo, PC

(57) ABSTRACT

An opening for forming a gate electrode is provided by a first photoresist pattern formed on an insulating film. Reactive ion etching by inductively coupled plasma is applied to the insulating film through the first photoresist pattern as a mask to thereby expose the surface of a GaN semiconductor layer, evaporating thereon a gate metal such as NiAu, thereby forming the gate electrode by self-aligned process. This prevents an oxidized film from being formed on the surface of the semiconductor layer. After the gate electrode is formed, a second photoresist pattern is formed to form a field plate on the gate electrode and the insulating film through the second photoresist pattern as a mask. Thereby, Ti having a high adhesiveness with an insulating film made of SiN or the like can be used as a field plate metal.

7 Claims, 3 Drawing Sheets

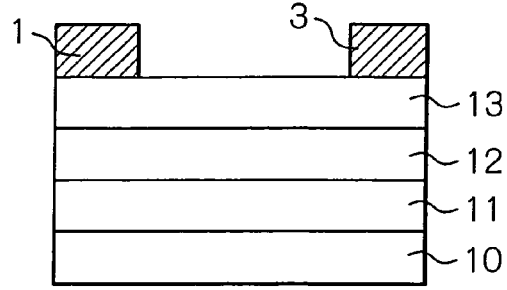
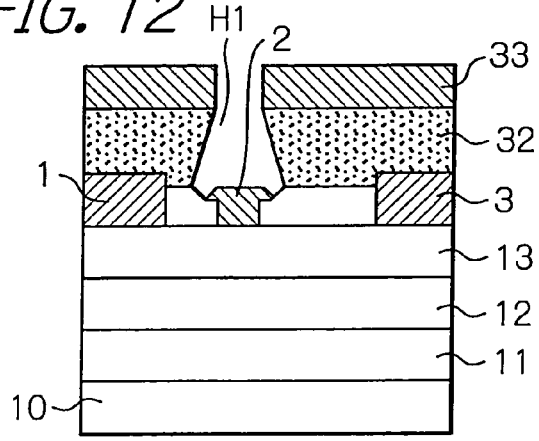
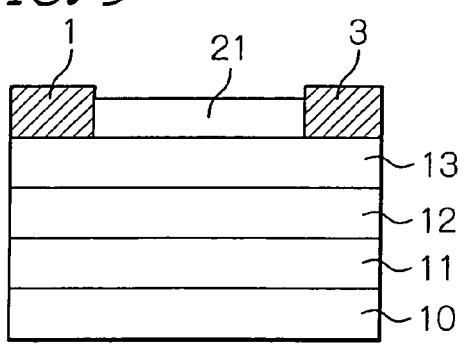
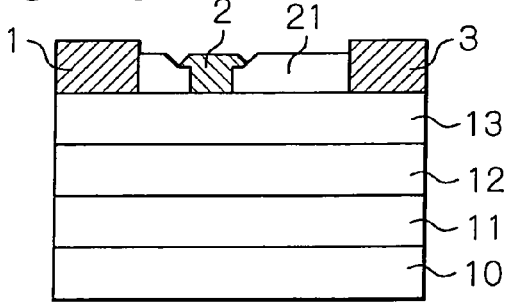
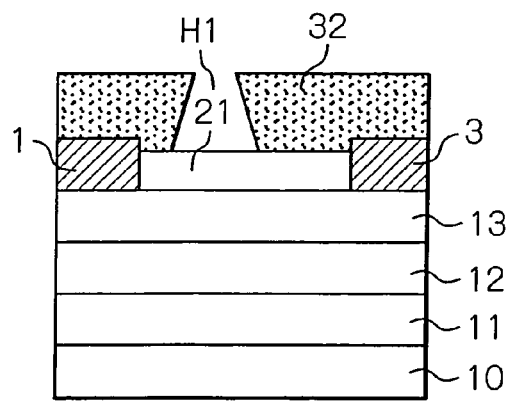
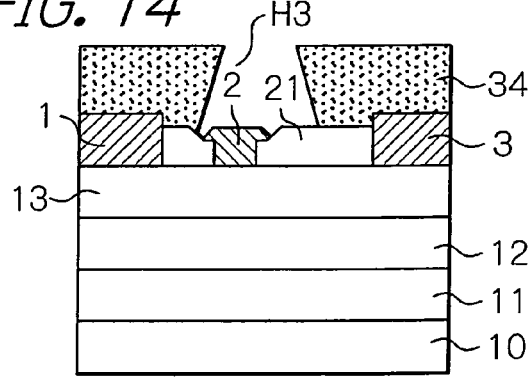
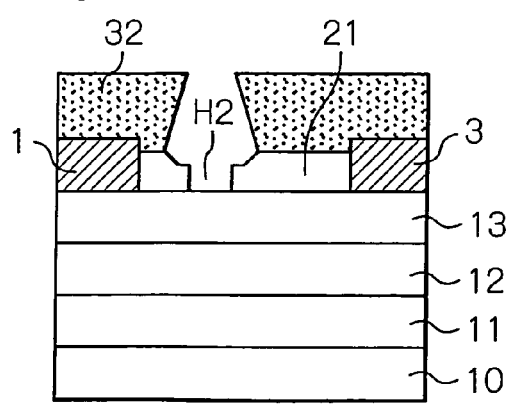
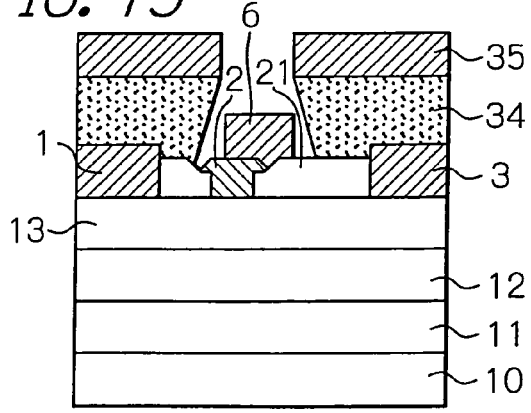

US 7,811,872 B2

METHOD FOR MANUFACTURING A FIELD EFFECT TRANSISTOR HAVING A FIELD PLATE

BACKGROUND OF THE INVENTION

1. Field of the Invention

The present invention relates to a method for manufacturing a field effect transistor (FET) having a gate electrode, such as a GaN-based FET having a gate electrode for use in a power amplifier.

2. Description of the Background Art

In an FET for use in a power amplifier required to have a high breakdown voltage, a field plate is often provided in its gate electrode to relax electric field concentration in the drain electrode side end portion of the gate electrode, thereby reducing Schottky reverse leakage and improving a drain breakdown voltage.

FIG. 2 shows a conventional FET having a field plate disclosed in U.S. patent application publication No. 2006/0102929 A1 to Okamoto et al. This FET has a cross-sectional structure shown in FIG. 2, including an undoped GaN semiconductor layer having a buffer layer 11, a channel layer 12, and an electron supply/Schottky barrier layer 13 formed on a substrate 10 in this order, a source electrode 1, a gate electrode 2, and a drain electrode 3 being arranged on the top surface of the GaN semiconductor layer. An insulating film 21 isolates the source electrode 1 from the gate electrode 2, and the gate electrode 2 from the drain electrode 3. A field plate 5 is provided which overhangs the insulating film 21 from the gate electrode 2 toward the side of the drain electrode 3 in a visored shape.

This FET is manufactured by the following steps as FIGS. 3-7 showing the manufacturing method. In the first step, FIG. 3, the buffer layer 11, the channel layer 12, and the electron supply/Schottky barrier layer 13 are formed on the surface of the substrate 10 made of sapphire, SiC, Si, or the like in this order. The buffer layer 11 is designed in configuration depending upon the material of the substrate 10. For example, in the case of an SiC substrate, the buffer layer 11 is constituted by an AlN film having its film thickness of about 0.1 μm and a GaN film having its film thickness of about 0.5 μm. The channel layer 12 is a GaN film having its film thickness of about 2 μm and serving as an electron transport layer. The electron supply/Schottky barrier layer 13 is an AlGaN film having its film thickness of about 20 nm and including about 20 percent of Al.

Next, on the electron supply/Schottky barrier layer 13, metal such as Ti/Al is evaporated to form the source electrode 1 and the drain electrode 3, and then these electrodes are annealed at 650 degree centigrade to provide ohmic contact between these electrodes and the layer 13.

In the second step 2, FIG. 4, on the surface of the electron supply/Schottky barrier layer 13 between the source electrode 1 and the drain electrode 3, the insulating film 21 made of SiN is formed by a plasma-enhanced CVD (Chemical Vapor Deposition) method or the like.

In the third step 3, FIG. 5, a part of the insulating film 21 is removed by etching to provide an opening HA for forming the gate electrode 2 so that the electron supply/Schottky barrier layer 13 is exposed.

In the step 4, FIG. 6, on the top of these layers provided with the source electrode 1, the drain electrode 3 and the opening HA, a resist material is applied to form a photoresist pattern 30 having an opening HB exposing an area for forming the gate electrode 2 and a field plate 5 by a photolithography technique. Further, a residue of the resist material is removed by an $O_2$ plasma ashing.

Finally, in the fifth step 5, FIG. 7, Ni/Au is evaporated through the opening HB of the photoresist pattern 30 to form the gate electrode 2 and the field plate 5 into one. This forms the gate electrode 2 joined with the electron supply/Schottky barrier layer 13 by Schottky junction, and the field plate 5 overhanging the insulating film 21 from the gate electrode 2 to the drain electrode 3 side in a visored shape. Thereafter, the photoresist pattern 30 and Ni/Au deposited thereon are removed to thereby obtain the structure in FIG. 2.

Since the Group III nitride semiconductor including GaN is used for this FET, the FET has a wide band gap, a high dielectric breakdown electric field, and high electron saturation drift velocity. Further, because carrier gas can be utilized bi-dimensionally by the heterojunction, the FET is expected as an electronic device which is excellent in high-temperature operation, high-speed switching operation, large-power operation, and the like.

However, the above-described FET has the following problems. The first problem is that the field plate 5 tends to be separated from the insulating film 21. Metal Ni/Au is used for forming the field plate 5 and the gate electrode 2 into unity. Thereby, the problem is caused by a low adhesiveness between the Ni and SiN used for the insulating film 21. As a result, the problem can be caused by the field plate 5 likely to be separated from the insulating film 21 by a small disturbance.

Ti/Pt/Au is normally used for the gate electrode in a conventional GaAs-based FET. Since the adhesiveness between Ti and SiN is superior, such a problem is not caused which involves the separation. Also, since joining Ti with GaN is ohmic contact as employed with the source electrode 1 and the drain electrode 3, it cannot be used for the gate electrode requiring Schottky junction.

The second problem is that, in the fourth step, the $O_2$ plasma ashing is performed to remove the residue of the resist material when the photoresist pattern 30 is formed which has the opening HB exposing the area for forming the gate electrode 2 and the field plate 5. This $O_2$ plasma ashing oxidizes the surface of the electron supply/Schottky barrier layer 13 in the area for forming the gate electrode 2 thereafter to form an oxidized film between the gate electrode 2 and the electron supply/Schottky barrier layer 13. Thereby, a problem that a gate leakage current increases is caused, as described in Tamotsu HASHIZUME, et al., "Surface Control Process of AlGaN for Suppression of Gate Leakage Currents in AlGaN/GaN Heterostructure Field Effect Transistors" Japanese Journal of Applied Physics, Vol. 45, No. 4, pp. L111-L113.

SUMMARY OF THE INVENTION

It is an object of the present invention to provide a GaN-based FET that has a high adhesiveness between a field plate and an insulating film and does not have an oxidized film between a gate electrode and a semiconductor layer, and a method of manufacturing the same.

In accordance with the present invention, a method for manufacturing a transistor having a field plate includes the steps of: forming a source electrode and a drain electrode on a surface of a GaN semiconductor substrate; forming an insulating film on the surface of the GaN semiconductor substrate between the source electrode and the drain electrode; forming a first resist pattern for providing an opening corresponding to a gate electrode on the insulating film; using the first resist pattern as a mask to apply anisotropic reactive ion etching by inductively coupled plasma to the insulating film to thereby form the opening exposing the surface of the GaN semiconductor substrate through the insulating film; depositing Ni and another metal for the gate electrode in series in the opening by self-aligned process using the first resist pattern to thereby form the gate electrode; removing the first resist pattern, and the Ni and the other metal for the gate electrode deposited on the Ni; forming a second resist pattern for forming a field plate overhanging the insulating film from the gate electrode toward the drain electrode in a visored shape; using the second resist pattern as a mask to deposit Ti and another metal for the field plate in series on the gate electrode and the insulating film to thereby form the field plate; and removing the second resist pattern, and the Ti and the other metal for the field plate deposited on the Ti.

In the present invention, the first resist pattern is formed for providing the opening corresponding to, or for forming, the gate electrode on the insulating film, which is used as a mask for reactive ion etching by inductively coupled plasma to the insulating film to form the opening exposing the surface of the GaN semiconductor substrate. Since the insulating film may be formed by oxide silicon ($SiO_2$), silicon oxynitride (SiON), silicon nitride (SiN) or the like, gas used for the reactive ion etching may be sulfur hexafluoride ($SF_6$), carbon tetra fluoride ($CF_4$), or the like. Therefore, oxygen is not used for etching the insulating film. Thereby, since an oxidized film is not formed on the surface of the GaN semiconductor substrate, the gate electrode can be directly formed on the GaN semiconductor substrate.

In addition, after the gate electrode is formed, the second resist pattern is formed which is the mask for forming the field plate on the gate electrode and the insulating film. Thereby, Ti having a high adhesiveness with an insulating film made of SiN or the like can be used as metal for the field plate.

BRIEF DESCRIPTION OF THE DRAWINGS

The objects and features of the present invention will become more apparent from consideration of the following detailed description taken in conjunction with the accompanying drawings in which:

FIGS. 8 through 15 are cross-sectional views showing the first through eighth processing steps, respectively, in sequence for fabricating the FET according to the illustrative embodiment.

DESCRIPTION OF THE PREFERRED EMBODIMENT

Figure 1:
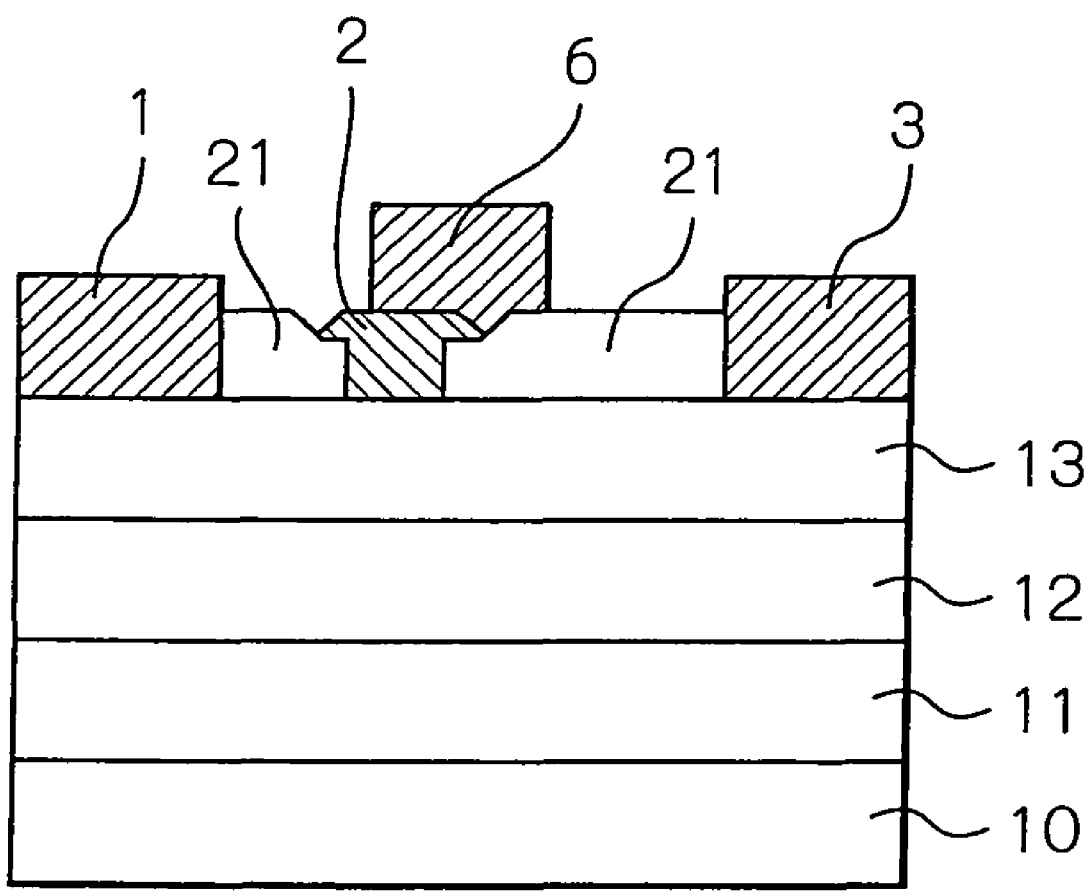
FIG. 1 is a vertical cross-sectional view of a preferred embodiment of an FET in accordance with the present invention.
Figure 2:
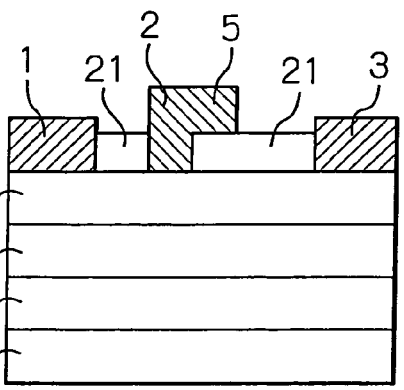
FIG. 2 is a vertical cross-sectional view of a conventional FET.
Figure 3:
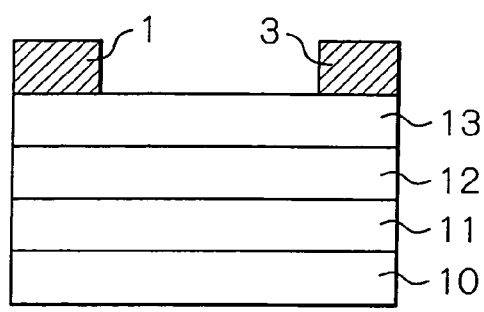
FIGS. 3 through 7 are cross-sectional views showing the first through fifth processing steps, respectively, in sequence for fabricating the conventional FET shown in FIG. 2.
Figure 4:
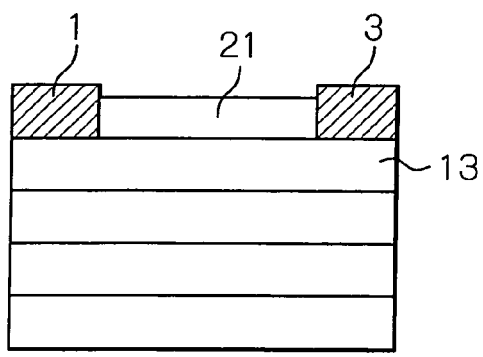
Figure 5:
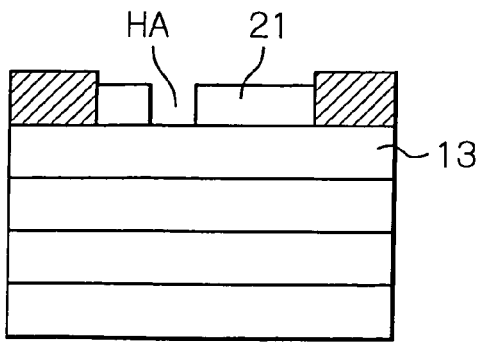
Figure 6:
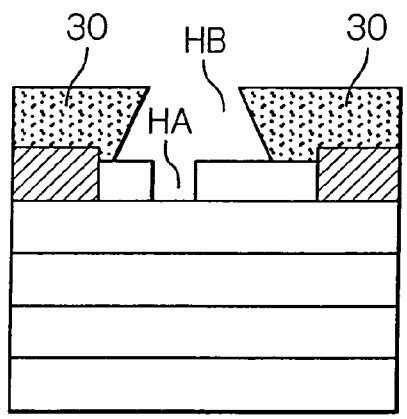
Figure 7:
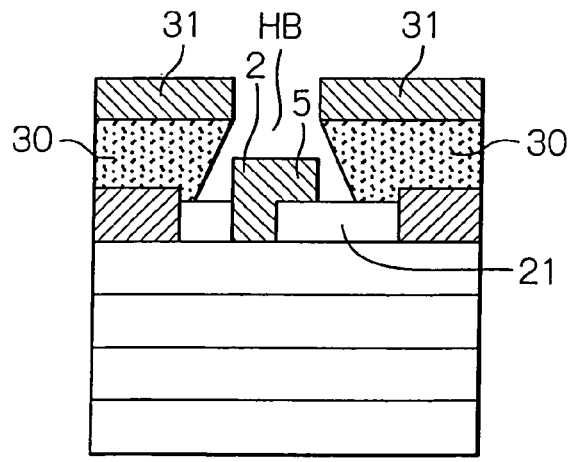

A preferred embodiment in accordance with the present invention will be described below with reference to the accompanying drawings. Since the drawings are merely for illustration, the present invention is not to be restricted by what are shown in the drawings. Specifically, those drawings are simplified schematic representations intended to generally illustrate the shape, size, and positional relationships of the various structural components to the extent that the present invention can be understood by those skilled in the art. For the purpose of better understanding, the figures are drawn with some dimensions exaggerated. Further, preferred exemplary configurations of the invention will be given below. However, the materials used, numerical conditions and so forth given below are nothing but examples in the scope included in the essence of the invention.

FIG. 1 is a schematic block diagram showing a field effect transistor (FET) in accordance with an embodiment of the present invention. Like components and elements are designated with identical reference numerals. This FET has a cross-sectional structure shown in FIG. 1, including an undoped GaN semiconductor layer having a buffer layer 11, a channel layer 12, and an electron supply/Schottky barrier layer 13 formed in this sequence on a substrate 10 made of sapphire, SiC, Si, or the like. In the figures, some of the cross sections are indicated without hatchings merely for the purpose of simplicity.

The buffer layer 11, for example, when the substrate 10 is made of SiC, is constituted by an AlN film having its film thickness of about 0.1 μm and a GaN film having its film thickness of about 0.5 μm, with the illustrative embodiment. The channel layer 12 is a GaN film having its film thickness of about 2 μm and serving as an electron transport layer. The electron supply/Schottky barrier layer 13 is an AlGaN film having its film thickness of about 20 nm including about 20 percent of Al.

On the surface of the electron supply/Schottky barrier layer 13 of the GaN semiconductor layer, arranged are a source electrode 1, a gate electrode 2, and a drain electrode 3. The source electrode 1 and the drain electrode 3 are made of metal such as Ti/Al, and the gate electrode 2 is made of metal such as Ni/Au.

In order to isolate the source electrode 1 from the gate electrode 2, and the gate electrode 2 from the drain electrode 3, provided is an insulating film 21 made of SiN. Over the insulating film 21, a field plate 6 is provided to extend from the gate electrode 2 toward the side of the drain electrode 3 in the form of visor. The field plate 6 is formed by a metal film such as Ti/Pt/Au.

FIGS. 8-15 show a process of manufacturing the FET shown in FIG. 1. With reference to those figures, description will be made below on how to manufacture the FET shown in FIG. 1.

In the first step, FIG. 8, on one of the primary surfaces of the substrate 10, the GaN semiconductor layer is formed which includes the buffer layer 11, the channel layer 12, and the electron supply/Schottky barrier layer 13. Next, onto the electron supply/Schottky barrier layer 13 of the GaN semiconductor layer, metal such as Ti/Al is evaporated to form the source electrode 1 and the drain electrode 3. Then, these electrodes are annealed at 650 degree C. to provide ohmic contact between these electrodes and the layer 13.

In the second step, FIG. 9, on the surface of the electron supply/Schottky barrier layer 13 between the source electrode 1 and the drain electrode 3, the insulating film 21 made of SiN is formed by a plasma-enhanced CVD method or the like.

Next, in the third step, FIG. 10, to the surface of the substrate on which the source electrode 1, the drain electrode 3, and the insulating film 21 are formed, a resist material is applied to form a photoresist pattern 32 and an opening or hole H1 exposing an area for forming, or corresponding to, the gate electrode 2 is made by a photolithography technique. The opening H1 of the photoresist pattern 32 is formed in an overhanging shape such that it has a small approach, and becomes bigger toward in its back. In other words, the opening H1 has its inner side wall tapered from the side of the substrate 10 toward the outer surface of the photoresist pattern 32.

In the fourth step, FIG. 11, to the insulating film 21 exposed in the opening H1 of the photoresist pattern 32, RIE (Reactive Ion Etching) by ICP (Inductively Coupled Plasma) process is applied to form the opening H2 exposing the surface of the electron supply/Schottky barrier layer 13 in the insulating film 21.

In this ICP-RIE process, ICP power is 20 W to 100 W, RIE power is 5 to 50 W, air pressure in an etching chamber is 1 mTorr to 100 mTorr, and introduced gas is $SF_6$. As shown in FIG. 11, this forms the opening H2 constituted by a hole penetrating to an area for forming, or corresponding to, the gate electrode 2 in a part of the insulating film 21 and a portion formed by slightly trimming the circumference of the surface of the hole. After the opening H2 is formed, a residue by etching is removed by water and a drying process is performed.

In the fifth step, FIG. 12, an Ni/Au gate metal 33 is vacuum-evaporated through the opening H1 using the photoresist pattern 32 as a mask by electron beam evaporation method. Thereby, the gate electrode 2 made of Ni/Au is formed which is joined with the electron supply/Schottky barrier layer 13 by Schottky junction in the area, for forming the gate electrode 2, exposed in the opening H2 of the insulating film 21.

In the sixth step, FIG. 13, the photoresist pattern 32 and the gate metal 33 deposited thereon are removed.

In the seventh step, FIG. 14, to the surface of the substrate on which the source electrode 1, the drain electrode 3, the insulating film 21 and the gate electrode 2 are formed, a resist material is applied to form a photoresist pattern 34, and an opening H3 exposing the area for forming the field plate 6 is cut by a photolithography technique. The opening H3 of the photoresist pattern 34 is formed in an overhanging shape such that it has a small approach, and becomes bigger toward in its back.

In the eighth step, FIG. 15, a Ti/Pt/Au field plate metal 35 is vacuum-evaporated through the opening H3 using the photoresist pattern 34 as a mask by the electron beam evaporation method. The film thicknesses of Ti, Pt, and Au are, for example, 100 nm, 50 nm, and 700 nm, respectively. Thus, the field plate 6 is formed on such surface of the gate electrode 2 and the insulating film 21 which corresponds to the opening H3.

Thereafter, the photoresist pattern 34 and the field plate metal 35 deposited thereon are removed to thereby obtain a structure in FIG. 1.

As described above, in accordance with the embodiment of the present invention, the structure and the manufacturing method of the FET have the following advantages. The field plate 6 is joined with the insulating film 21 by a Ti film. Since Ti has an excellent adhesiveness with SiN forming the insulating film 21, the field plate 6 is not likely to be separated from the insulating film 21.

The ICP-RIE method is also used for forming the opening H2 for the gate electrode 2 on the insulating film 21. Since this ICP-RIE method has high plasma density, etching can be performed by low power. Therefore, the method can reduce damage to semiconductors and the residue caused by RIE in the opening H2, and does not need $O_2$ plasma ashing. Therefore, an oxidized film is not formed on the surface of the electron supply/Schottky barrier layer 13 in the opening H2, thereby reducing a gate leakage current. This can form an FET structure having a stable performance which is excellent in high-temperature operation, high-speed switching operation, large-power operation, and the like which are strong points of GaN-based semiconductors.

In addition, the gate electrode 2 is formed by self-aligned process using the photoresist pattern 32 for use in forming the opening H2, thereafter forming the field plate 6. This can reduce an overhang width of the field plate 6 toward the side of the source electrode 1. Specifically, the conventional process causes an overhang width corresponding to the alignment accuracy of an exposure apparatus. The overhang width was of, for example, the accuracy of about 0.2 μm, in the case of steppers. However, the method of the present invention causes an overhang width of the gate of about 0.03 μm decisive by the self-aligned process. That difference of 0.17 μm reduces a gate-to-source parasitic capacitance closely related to the spatial distance between the source electrode and the gate electrode, thereby contributing to improvement of a cut-off frequency characteristic of an FET.

Additionally, the field plate 6 is formed on the gate electrode 2 by using the photoresist pattern 34 different from the photoresist pattern 32 used for forming the gate electrode 2. This can control the thicknesses of the gate electrode 2 and the field plate 6 freely to thicken the gate metal combining them, thereby reducing the gate resistance. Thus, when a single photoresist pattern was used in the conventional art, the thickness of the deposited metal depended on the thickness of a photoresist pattern, thereby the thickness of the gate metal (Au) being 700 nm. However, the method of the present invention can increase the thickness of the gate metal to about 1400 nm by depositing metal twice, thereby reducing the gate resistance by about 50 percent compared to the conventional art.

The entire disclosure of Japanese patent application No. 2007-129970 filed on May 16, 2007, including the specification, claims, accompanying drawings and abstract of the disclosure, is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A method for manufacturing a field effect transistor having a field plate, comprising the steps of:
    forming a source electrode and a drain electrode on a surface of a GaN semiconductor substrate;
    forming an insulating film on the surface of the GaN semiconductor substrate between the source electrode and the drain electrode;
    forming a first resist pattern for providing an opening corresponding to a gate electrode on the insulating film;
    using the first resist pattern as a mask to apply anisotropic reactive ion etching by inductively coupled plasma to the insulating film to thereby form the opening exposing the surface of the GaN semiconductor substrate through the insulating film;
    depositing a gate metal in the opening by self-aligned process using the first resist pattern to thereby form the gate electrode;
    removing the first resist pattern, and the gate metal;
    forming a second resist pattern for forming a field plate overhanging the insulating film from the gate electrode toward the drain electrode in a visored shape;
    using the second resist pattern as a mask to deposit Ti and another metal for the field plate in series on the gate electrode and the insulating film to thereby form the field plate; and
    removing the second resist pattern, and the Ti and the other metal for the field plate deposited on the Ti.

2. The method in accordance with claim 1, wherein the insulating film is silicon nitride.

3. The method in accordance with claim 1, wherein the second resist pattern has an opening, and the opening of the first and second resist patterns has an inner side wall tapered from a side of the substrate toward a surface of the first and second resist patterns, respectively.

4. The method in accordance with claim 1, wherein the field plate is formed by a metal film thicker than the gate electrode.

5. A field effect transistor having a field plate, comprising:
- a source electrode and a drain electrode formed on a surface of a GaN semiconductor substrate;
- an insulating film formed on the surface of said GaN semiconductor substrate between the source electrode and the drain electrode;
- said insulating film having an opening exposing the surface of said GaN semiconductor substrate, the opening being formed by using a first resist pattern for providing the opening as a mask to apply anisotropic reactive ion etching by inductively coupled plasma to said insulating film;
- a gate electrode formed by depositing a gate metal; for said gate electrode in series in the opening by self-aligned process using the first resist pattern, and removing the first resist pattern and the gate metal; and
- a field plate formed by using as a mask a second resist pattern for forming said field plate overhanging said insulating film from said gate electrode toward said drain electrode in a visored shape to deposit Ti and another metal for said field plate in series on said gate electrode and said insulating film, and removing the second resist pattern and the Ti and the other metal for said field plate deposited on the Ti.

6. The method in accordance with claim 1, wherein the metal for the gate electrode is a first metal, and the metal for the field plate is a second metal.

7. The field effect transistor in accordance with claim 5, wherein the metal for the gate electrode is a first metal, and the metal for the field plate is a second metal.

* * * * *